United States Patent [19]

Culp

[11] Patent Number: 5,241,233
[45] Date of Patent: Aug. 31, 1993

[54] ELECTRIC DRIVE FOR A RECTIFYING SEGMENTED TRANSDUCER

[75] Inventor: Gordon W. Culp, Van Nuys, Calif.

[73] Assignee: Rockwell International Corporation, Seal Beach, Calif.

[21] Appl. No.: 852,053

[22] Filed: Mar. 16, 1992

[51] Int. Cl.$^5$ .................... H01L 41/04; H01L 41/08; H01L 41/18; H02N 2/00
[52] U.S. Cl. ..................................... 310/317; 310/311
[58] Field of Search .............. 310/317, 311, 316, 318, 310/328, 323

[56] References Cited

U.S. PATENT DOCUMENTS

| | | | |
|---|---|---|---|
| 4,237,399 | 12/1980 | Sakamoto | 310/317 |
| 4,608,506 | 8/1986 | Tanuma | 310/317 X |
| 4,628,275 | 12/1986 | Skipper et al. | 330/10 |
| 4,641,052 | 2/1987 | Kobayashi | 310/317 |
| 4,841,191 | 6/1989 | Takata et al. | 310/317 |
| 4,928,030 | 5/1990 | Culp | 310/328 |
| 5,027,028 | 6/1991 | Skipper | 310/328 |

*Primary Examiner*—Steven L. Stephan
*Assistant Examiner*—Ed To
*Attorney, Agent, or Firm*—H. Fredrick Hamann; Harry B. Field; Steven E. Kahm

[57] ABSTRACT

The continuous bipolar mechanical output of a nonrectifying transducer is synthesized when the electrical segments 2 of a rectifying transducer are alternately switched into and out of a resonant loop in synchronism with polarity changes of the alternating drive signal. The known extraordinary transduction efficacy of a diverse class of rectifying transducer materials is thereby advantageously applied, while the known high electrical efficiency of resonance is also applied. Continuous bipolar transduction provides essential ingredients for the synthesis of nonsinusoidal mechanical output waveforms that afford extraordinary mechanical efficiency in a growing class of mechanical actuators, such as forcers, positioners and rubless walkers. Electrical resonance, in combination with nonsinusoidal mechanical waveforms, therefore provide a segmented rectifying transducer drive system of extraordinary efficacy.

7 Claims, 1 Drawing Sheet

ELECTRIC DRIVE FOR A RECTIFYING SEGMENTED TRANSDUCER

BACKGROUND OF THE INVENTION

1. Field of the Invention

The present invention relates generally to drive means for electrical transducers and, in particular, to an electrically resonant system for responsively driving a rectifying segmented transducer in order to produce the effect of a nonrectifying transducer.

2. Description of the Related Art

A diverse class of electromechanical transducers includes electrostrictive and state-change ferroelectric materials, some magnetic devices including solenoids and related permeable devices. This class produces a mechanical action in the same sense, regardless of the polarity of the applied electrical signal, a production also known as mechanical rectification. Most of the representatives of this class of transducers conduct an amount of electrical energy that is large relative to the electrical energy actually transduced to useful mechanical work, the conducted energy taking the form of capacitive, inductive, or a combination of capacitive and inductive reactance currents. Relatively high electrical efficiency obtains when little of the conducted reactive electrical power is wasted by the electric drive means. By way of example, electrical resonance allows the generation of substantial quantities of reactive energy, often with larger currents and potentials than are otherwise handled by commonly available electronic components. However, electrical resonance is by nature bipolar and essentially symmetric about current and potential average values, the averages usually being zero. Aside from a relatively sparse class of applications that benefit from cyclical rectified mechanical strokes, rectifying transducers are not conveniently made components of an electrically resonant circuit.

Applicant's patent, U.S. Pat. No. 4,928,030, entitled Piezoelectric Actuator issued May 22, 1990, which is hereby made a part hereof and incorporated herein by reference, describes kinds of nonrectifying actuators and transducers that convert electrical signals to forceful mechanical strokes. These transducers generally employ a transducing action in which the mechanical stroke is essentially proportional to the instantaneous amplitude of the applied electrical signal, for example, to the current or to the potential. The proportional response-includes the polarity of the applied electrical signal. The piezoelectric shear embodiments of the taught transducers use bipolar symmetric transduction to obtain a mechanical stroke that is larger than comparable thickness-mode or extension-mode piezoelectric transducers, the latter being generally restricted to monopolar electric drive. Another taught advantage is smooth walking actuation using nonsinusoidal electric drive signals that produce a mechnical walking stroke that forcefully positions an object by traction in a range of positions far exceeding the range provided by a single stroke of the actuator. High mechanical efficiency obtains when the nonsinusoidal electrical and mechanical actions produce the walking without rubbing. However, high electrical efficiency is more difficult to achieve because the inherent high efficiency of electrical resonance is precluded by the exclusion of the sinusoidal electrical wave forms generally accompanying resonance.

Applicant's copending application Ser. No. 07/488,548 filed Mar. 5, 1990 and continued as Ser. No. 07/743,069 filed Aug. 9, 1991 entitled Electric Drive for a Segmented Transducer, which is hereby made a part hereof and incorporated herein by reference, teaches an electric drive means for a segmented transducer, including the transducers described in his Piezoelectric Actuator patent cited above, wherein each segment or subset of segments is stimulated into electrical resonance by a separate circuit. Each subset is made to resonate at a prescribed amplitude, phase, polarity and frequency in accordance with the requirements of the desired nonsinusoidal mechanical stroke, and using the rules of the Fourier Theorem. Unlike conventional Fourier synthesis, wherein a nonsinusoidal waveform is made of components that are electrically summed, the drive means of this invention creates a nonsinusoidal mechanical stroke by mechanical summation of sinusoidal mechanical stroke components. The taught methods apply to transducers that are essentially linear, bipolar, and symmetric in response. Methods of mechanically summing nonsinusoidal stroke wave forms using Fourier synthesis when transducers are rectifying are not known.

Applicant's copending application Ser. No. 07/836,495 entitled Walking Toothed Actuator filed Feb. 18, 1992 which is hereby made a part hereof and incorporated herein by reference, describes a subclass of piezoelectric actuators, herein cited as an example, achieves, by means of engaged teeth, large transducer actuating forces relative to equivalent actuators that rely solely on traction. However, unlike traction actuators, toothed actuators are intolerant of any walking stride that is not an integer of the tooth length period. The toothed class of actuator requires period matching stride length beginning with the first stride of operation, and therefore requires an electrical drive means that provides full stride electrical amplitudes, while also providing an electrical efficiency appropriate to the relatively high electromechanical efficiency of the toothed piezoelectric actuator. It also teaches a method of switching a transducer segment into and out of a resonant electrical circuit in a manner that preserves resonance while immediately bringing the transducer to full operating effectiveness, wherein after initiation of activation, the transducer continues in a bipolar mean-zero operating mode until switched out of the circuit. An electric drive means for the toothed actuator is also described. The taught methods are not applicable to rectifying transducers, except in a sparse class of applications that benefit from rectified mechanical cyclical strokes.

Many piezoelectric electrostrictive materials are rectifying. Cross, L. E. et al. Large Displacement Transducers Based on Electric Field Forced Phase Transitions in the Tetragonal $(Pb_{0.97}La_{0.02})(Ti,Zr,Sn)O_3$ Family of Ceramics, J. Appl. Phys., vol 66, (12), Dec. 15, 1989, p 6014–6023, describes one family of compositions of ceramic piezoelectric materials that mechanically rectify an applied electrical drive signal when the intensity of an applied electric field lies in prescribed proximity to the field intensity at which a phase transition occurs. Another well known example of a rectifying transducer is the magnetic solenoid that pulls in one direction regardless of the direction of current flow in the solenoid winding. Another example is electrostriction in which electrostrictive material changes shape in a sense that maintains the same polarity regardless of the direction of the applied magnetic field.

SUMMARY OF THE INVENTION

A rectifying transducer actuator comprises (at least) two independently electrically addressable segments conjoined so that the mechanical output consists of the sum of the mechanical strokes of the segments. The senses of the outputs of the segments are made antiparallel. The segments are connected in an electrically resonant loop by way of a switch. The first segment is connected to the loop by a corresponding first position of the switch during a positive half resonant cycle. At the end of the first half cycle the switch changes states to a second position corresponding to the disconnection of the first segment from the loop and connection of the second segment to the loop, the second segment being empowered by the second half cycle. Additional alternating switch state changes maintain electrical resonance in the loop while transducer segments respond alternately to corresponding half cycles of the resonant signal. Alternating transducer segment response causes the output of the transducer to be mechanically continuous and bipolar, and, provided segments have equivalent responsivity, output is symmetric about a mean zero mechanical position. A transducer that provides nonsinusoidal mechanical strokes by Fourier mechanical synthesis comprises two or more pairs of segments driven as described. High electrical efficiency obtains by use of electrical resonance. Mechanical resonance is optional. High mechanical efficiency obtains in applications of rectifying transducers that produce nonsinusoidal mechanical strokes and thereby avoid mechanical losses that are more commonly assoicated with the losses of single-frequency resonance activation.

OBJECTS OF THE INVENTION

The primary object of the invention is the electrical drive of a rectifying transducer actuator in a manner that produces a mechanical output equivalent to the output of a nonrectifying transducer.

Another object is the obviation of drive bias for nonrectifying but monopolar input transducer actuators.

A further object is the achievement of high electrical efficiency by resonant activation of rectifying transducer actuators.

Still another object is the achievement of high mechanical efficiency made possible by using the bipolar output of rectifying transducers to synthesize nonsinusoidal mechanical waveforms.

BRIEF DESCRIPTION OF THE DRAWINGS

For a more complete understanding of the present invention and for further advantages thereof, the following Detailed Description of the Invention makes reference to the accompanying Drawings, in which.

DETAILED DESCRIPTION OF THE INVENTION

The present invention comprises a system for driving a segmented rectifying transducer actuator, such as piezoelectric ferroelectric phase-change materials, electrostrictive materials, and magnetostrictive materials. A rectifying transducer is hereinafter defined as a transducer that produces a mechanical output in a consistent sense without regard to the polarity of the applied electrical drive signal.

Figure 1:
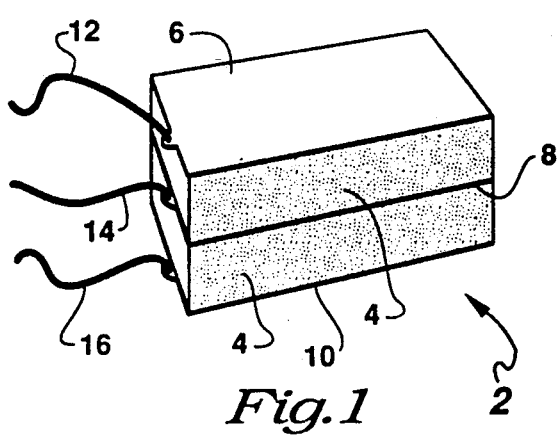
FIG. 1 is a perspective view of a rectifying transducer segment in a quiescent state.
Figure 2:
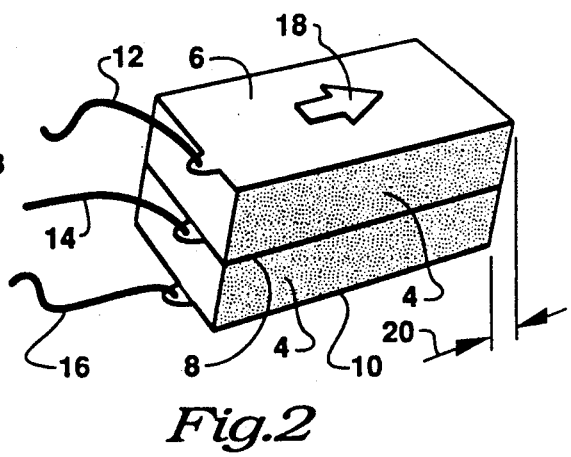
FIG. 2 is a perspective view of the transducer segment of FIG. 1 when an electric signal is applied.
Figure 3:
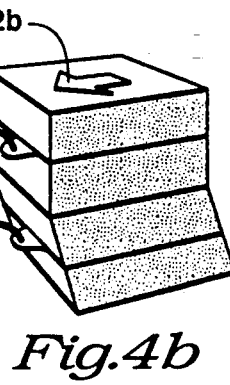
FIG. 3 is an historical plot of applied electric signal amplitude and resultant mechanical stroke of the rectifying transducer segments of FIG. 1.
Figure 5:
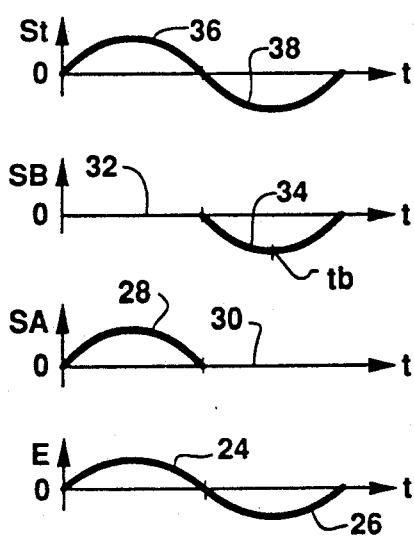
FIG. 5 is an historical plot of the electrical signal applied to the actuator of FIG. 4, the response of each segment, and the summed mechanical stroke when activation is in accordance with the present invention.

For a clear understanding of the present invention, FIGS. 1-3 provide an introduction to segmentation and response of rectifying transducers. FIG. 1 shows a quiescent rectifying transducer segment 2 comprising transducer bodies 4, ground electrodes 6 and 10, and active electrode 8. Ground electrodes 6 and 10 are connected to electrical ground by respective leads 12 and 16, while active electrode 8 is connected to an electric drive means by lead 14.

FIG. 2 is a view of the transducer segment of FIG. 1 after the application of an electric signal, for example, of positive polarity, to lead 14. The signal causes transducer bodies 4 to deform to produce a mechanical stroke. The illustrated segment is an example of shear, wherein electrode 6 translates parallel to the plane of electrode 10 in direction 18 by a mechanical stroke distance 20. It is not necessary that the stroke be linearly related to the amplitude of the applied electric signal, and other deformations of body 6 will suffice in place of shearing shown by way of example. When the polarity of the signal applied to lead 14 is reversed but the absolute value of the amplitude is maintained (symmetric tranducer assumed), the rectifying transducer produces the same mechanical stroke 20 as before.

FIG. 3 is a time plot of the amplitude E of the bipolar alternating electric signal applied to lead 14 of the transducer segment of FIG. 1, and a plot of the mechanical stroke S that is the distance moved by electrode 6 relative to (stationary) electrode 10.

Figures 4A, 4B:
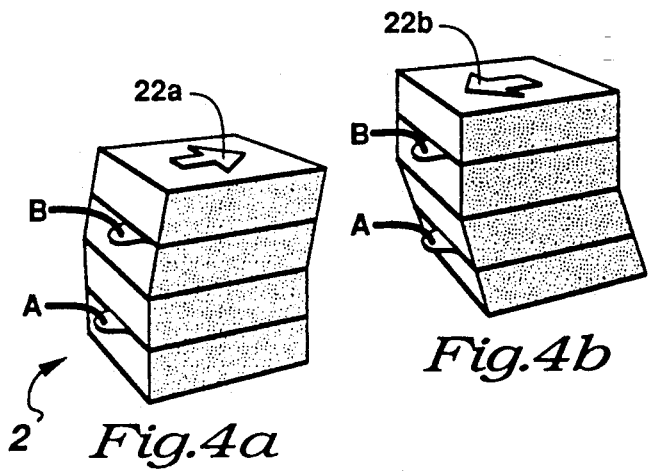
FIG. 4a is a perspective view of segments composed of two of the segments of FIG. 1 with the top segment activated.
FIG. 4b is a perspective view of an actuator composed of two of the segments of FIG. 1 with the bottom segment activated.

FIGS. 4a and 4b are views of an actuator 2 made by joining two segments of FIG. 1 by their proximate ground electrodes, for example, electrodes 6 and 10. Ground connections are omitted for clarity. Joining in this manner precludes the use of electrically insulating layers between segments, and provides independent electrical addressability by way of leads A and B. The actuator in FIG. 4a is shown at an instant when zero potential resides on lead A and nonzero potential resides on lead B, resulting in a sum stroke in direction 22a consisting solely of the stroke contributed by the potential on lead B. The actuator in FIG. 4b is shown at an instant when zero potential resides on lead B and nonzero potential resides on lead A, resulting in a sum stroke in direction 22b consisting solely of the stroke contributed by the potential on lead A.

FIGS. 4a, 4b, 5 and 6 are used together to describe the interactions of the present invention, and are, respectively, a two-segment rectifying transducer actuator with the top segment activated in one direction, a two-segment rectifying transducer actuator with the bottom segment activated in the opposite direction, a time plot of the input and output of this actuator, and a schematic circuit portion of the electrical drive system.

Figure 6:
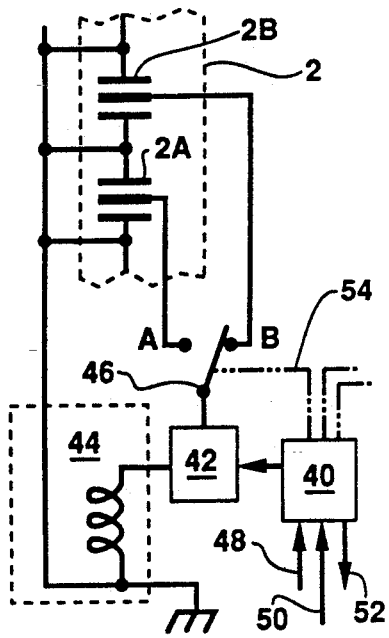
FIG. 6 is a schematic portion of the electrical system of the present invention.

Referring to FIG. 6, the electrical drive system of the present invention comprises controller 40, stimulator 42, electrical energy storage component 44, switch 46, and rectifying transducer actuator 2. Controller 40 receives activation instructions 48 and electrical power 50 by means of connections to external apparatus (omitted for clarity). The controller optionally issues status information 52 to said external apparatus. Controller 40 may use status information 52 to better drive the actuator. Controller 40 controls switch 46 to have state A and not state B, and alternatively, state B and not state A. Switch 46 connects either rectifying transducer segment 2A or rectifying transducer segment 2B to stimulator 42 and storage component 44. Upon receipt of an activation instruction 48, controller 40 supplies electrical energy 50 to stimulator 42 that connects a transducer segment into a resonant electrical loop comprising stimulator 42 and storage component 44. In a first half cycle 24 (FIG. 5), taking amplitude E positive, switch 46 is connecting transducer segment 2A in the resonant loop, during which segment 2A produces mechanical stroke 28 (FIG. 5) of amplitude SA, while segment 2B produces quiescent stroke amplitude SB of 32 (zero). During a second half cycle 26 switch 46 is connecting transducer segment 2B in the resonant loop, during which segment 2B produces mechanical stroke 34 (FIG. 5) of amplitude SB, while segment 2A produces quiescent stroke 30 of amplitude SA (zero). The sum stroke amplitude St of the entire actuator consists of stroke components 36 and 38, an actuator stroke related to input drive amplitude E. FIG. 4a illustrates segment 2B activated at instant tb (FIG. 5), at maximum negative amplitude, producing maximum amplitude mechanical stroke 34 in direction 22a. Stimulator 42 passes electrical power from controller 40 to the switched resonant loop. In the example of a capacitive transducer, stimulator 42 may be the primary winding of a resonant transformer in which inductance 44 is the secondary winding. The use of a resonant transformer separates the electrical power supplying function of controller 40 from the resonant loop, allowing each part of the system to operate at predetermined combinations of electric potential and current. For example, the supplying components of controller 40 may comprise in part solid state switching devices that operate with relatively high efficiency when voltages are low and currents are high, while the resonant loop (secondary) operates more efficiently with high voltage and moderate currents. Switch 46 is in the resonant loop and is required to pass all of the current during loop resonance activation. Transducer segments are therefore switched during instants of the cycle when electrical stress on the switch is minimum, and in many applications, negligible. The selection of components for stimulator 42, when transducer segments are other than capacitive reactive, will be apparent to those versed in the particular art.

Referring to FIG. 6, storage component 44 may be an inductor when transducer reactance is largely capacitive. The selection of the storage mechanism of component 44 follows from particular transducer characteristics. For example, a magnetostrictive transducer is largely inductive, requiring a largely capacitive component 44. Switch 46 in the interest of clarity is shown schematically as a mechanical switch, whereas presently preferred practice replaces each mechanical switch with an electronic switch to benefit from the latter's switching speed, freedom from contact bounce, and large capacity to pass current. The state of electronic switch 46 is changed by the controller by means of control line 54. FIG. 6 of an actuator 2 intends that other segments may be included, each pair of segments having a corresponding switched resonant loop, for example to allow the actuator to provide nonsinusoidal waveforms by Fourier mechanical synthesis. Actuator 2 indicates segments of the capacitive type as shown in FIGS. 1, 2, and 4 by way of example. It will be apparent that the symbols used for transducer segments 2A and 2B depend on the particular transducer mechanism employed.

Controller 40 provides actuator system status information to an external source by way of communications channel 52. Transducers such as piezoelectrics that are reciprocal, that is, those that transduce in either direction with essentially equal effectiveness, may use an undriven segment to transduce the mechanical state of strain within the transducer body to an electrical signal that is conditioned and communicated by controller 40 to data channel 52. Auxiliary sensors may be added to the transducer body to produce similar status signals, particularly when permeable-magnetic, magnetostrictive and other nonreciprocal transducers are driven.

In operation, the drive system of the present invention circulates the preponderance of the cycling electrical energy with relatively little loss, and thereby provides the relatively high electrical efficiency customarily associated with electrical resonance. Transducer segment switching provides a sum mechanical stroke of an otherwise rectifying transducer that simulates the output of a nonrectifying transducer, thereby allowing the synthesis of nonsinusoidal mechanical stroke waveforms from the outputs of two or more pairs of transducer segments. A diverse class of nonsinusoidal mechanical stroke waveforms is known to produce mechanical work with relatively high efficiency, particularly when such work is performed without incurring the losses associated with frictional heating due to rubbing. Relatively high electrical efficiency in combination, using the teachings of the present invention, with the relatively high mechanical efficiency, provides an advantageously high drive system efficiency. The drive system synthesizes the mechanical output of a nonrectifying transducer, allowing the advantageous use of the known high transducer effectiveness of a growing class of rectifying transducers.

The present invention is also applicable to the class of transducers that are monopolar but nonrectifying, including piezoelectric thickness mode and piezoelectric extension mode transducers. By way of example, the thickness mode piezoelectric transducer is monopolar in that an applied electrical signal consists of potential of only one polarity, namely, that polarity that creates an electric field within the transducer body that is parallel to the direction of the piezoelectric polarization in that body. Application of the opposite polarity signal may reduce the degree of polarization, may destroy the polarization, and may, given sufficient electric field intensity, reverse the direction of polarization. The thickness mode transducer produces an essentially linear mechanical stroke output in response to the applied monopolar signal. Conventional practice requires biasing the applied signal such that time varying potential components have a mean value approximately equal to half of the maximum applied potential. Given a fixed range of applied voltage, the half-voltage bias reduces the mechanical stroke of the transducer to half the value otherwise available to the case wherein the stroke amplitude encompasses the entire stroke range of the transducer. Applying the previously described methods to the example of the thickness mode piezoelectric transducer results in using the entire thickness stroke of each segment, alternately and monopolarly, without biased drive, and while incurring a factor of two increase in the bulk of the transducer compared to an equivalent transducer wherein every segment is driven all the time. The factor of two in bulk is relatively insignificant in a host of applications wherein known methods ameliorate the effect of transducer height in a direction perpendicular to the direction of action, and where other known methods compensate for height by changing other transducer body dimensions.

Although the present invention has been described with respect to specific embodiments thereof, various changes and modifications may be suggested to one skilled in the art. Therefore, it is intended that the present invention encompass such changes and modifications as fall within the scope of the appended claims.

I claim:

1. An electrical system for driving a rectifying transducer actuator comprising
   a circuit having,
   a first rectifying transducer,
   a second rectifying transducer,
   wherein the first rectifying transducer is attached to the second rectifying transducer such that the transducers have strokes in opposite directions when activated,
   a means of applying an activation signal having a wave form with positive and negative polarity portions to the transducers,
   a means of switching the positive polarity portion of the activation signal wave form to the first rectifying transducer and the negative polarity portion of the activation signal wave form to the second rectifying transducer,
   such that the rectifying transducer actuator moves in both a positive and a negative direction proportional to the activation signal, thus simulating the action of a non rectifying transducer's response to the same activation signal.

2. An electrical system for driving a rectifying transducer actuator as in claim 1 wherein the means of switching the positive polarity portion of the activation signal wave form to the first rectifying transducer and the negative polarity portion of the activation signal wave form to the second rectifying transducer, comprises a controller which operates a switch.

3. An electrical system for driving a rectifying transducer actuator as in claim 2 wherein the controller operates the switch in synchronism with the changes of polarity of the activation signal.

4. An electrical system for driving a rectifying transducer as in claim 2 wherein the controller provides electrical power from a source to a stimulating means which produces the activation signal sent to the rectifying transducers.

5. An electrical system for driving a rectifying transducer actuator as in claim 4 wherein the stimulating means maintains electrical resonance within the circuit.

6. An electrical system for driving a rectifying transducer actuator as in claim 4 wherein an auxiliary electrical impedance is in series with the stimulator means and the rectifying transducer to store electrical energy for timed release to the circuit.

7. An electrical system for driving a rectifying transducer actuator as in claim 6 wherein the auxiliary electrical impedance is an inductor.

* * * * *